United States Patent [19]
Hughes

[11] Patent Number: 5,180,478
[45] Date of Patent: Jan. 19, 1993

[54] SPUTTER COATING SOURCE

[75] Inventor: John L. Hughes, Rodeo, Calif.

[73] Assignee: Intevac, Inc., Santa Clara, Calif.

[21] Appl. No.: 633,586

[22] Filed: Dec. 19, 1990

[51] Int. Cl.⁵ .............................................. C23C 14/35
[52] U.S. Cl. .............................. 204/298.09; 204/192.2;
204/298.12; 204/298.19
[58] Field of Search ..................... 204/298.09, 298.12,
204/298.19, 192.2

[56] References Cited

U.S. PATENT DOCUMENTS

| | | | |
|---|---|---|---|
| 4,407,708 | 10/1983 | Landau | 204/192.13 |
| 4,412,907 | 11/1983 | Ito et al. | 204/298.19 |
| 4,485,000 | 11/1984 | Kawaguchi et al. | 204/298.12 |
| 4,500,409 | 2/1985 | Boys et al. | 204/298.03 |
| 4,565,601 | 1/1986 | Kakehi et al. | 156/643 |
| 4,855,033 | 8/1989 | Hurwitt | 204/298.09 |

FOREIGN PATENT DOCUMENTS 63-312976  12/1988  Japan ............................ 204/298.09

Primary Examiner—Aaron Weisstuch
Attorney, Agent, or Firm—Stanley Z. Cole

[57] ABSTRACT

Sputter coating source in which the target is mounted directly on the front side of the cathode and coolant is circulated on the back side of the cathode. The coolant does not contact the target, and the target is clamped tightly to the cathode by retainers which permit it to be removed and replaced easily without leakage of coolant.

7 Claims, 2 Drawing Sheets

SPUTTER COATING SOURCE

This invention pertains generally to sputter coating apparatus and, more particularly, to a particle source or gun for use in sputter coating applications.

Sputter coating is employed in the formation of films or coatings on workpieces such the deposition of magnetic materials on disks in the manufacture of storage media. Sputtering apparatus typically includes an anode and a cathode in a chamber filled with a gas such as argon, with a target of the material to be deposited mounted on or near the cathode. The gas is ionized by an electrical potential applied between the anode and cathode, with positively charged ions being attracted to the cathode. These ions impinge upon the target, causing material to be dislodged or ejected therefrom and deposit upon the workpiece.

A magnetron sputter coating source employs magnetic fields in combination with electric fields in the vicinity of the target. The magnetic fields can enhance glow discharge intensities and the attendant sputtering rates, extend operation to lower gas pressures, confine the glow discharge to the vicinity of the electrodes, and reduce electron bombardment of the workpiece. One example of a magnetron sputter coating source is found in U.S. Pat. No. 4,500,409, issued Feb. 19, 1985 to the assignee herein.

In many sputtering sources heretofore provided, the target material is bonded to a backing plate fabricated of a material such as copper, and water is circulated against the back side of the plate to cool the target. One problem with this arrangement is that an undesirable sputtering of the copper or other backing material can occur if the target is burned through. An even worse problem can occur if both the target material and the backing plate are burned through. Sputtering the backing material can contaminate the coating formed on the workpiece, and burning through the backing plate can cause the leakage of coolant into the sputtering chamber.

Sputtering targets are typically made of precious metals, and it is generally desirable to be able to recover the portion of the metal which remains when the target is spent. The bond between the target material and the backing plate is typically made with a high temperature solder, and this makes it difficult to recover the target material.

Also, with the coolant in direct contact with the back side of the backing plate, it is necessary to provide a seal between the backing plate and the structure on which it is mounted in order to contain the coolant, and leakage can occur when the target is replaced.

It is in general an object of the invention to provide a new and improved source or gun for use in sputter coating.

Another object of the invention is to provide a source or gun of the above character which overcomes the limitations and disadvantages of the sputtering sources heretofore provided.

These and other objects are achieved in accordance with the invention by providing a sputter coating source in which the target is mounted directly on the front side of the cathode and coolant is circulated on the back side of the cathode. The coolant does not contact the target, and the target is clamped tightly to the cathode by retainers which permit it to be removed and replaced easily without leakage of coolant.

Figure 1:
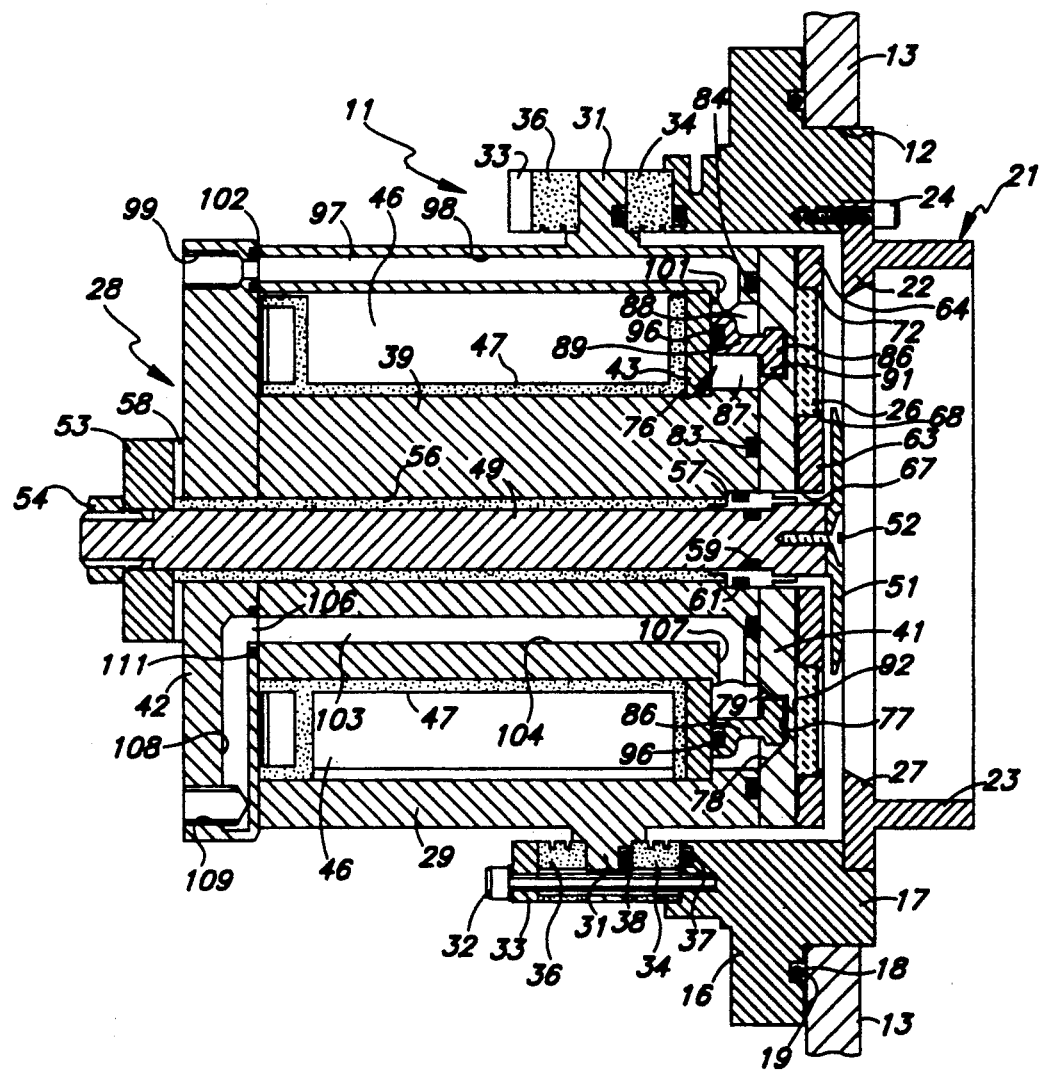
FIG. 1 is a vertical sectional view of one embodiment of a sputter coating source according to the invention.
Figure 2:
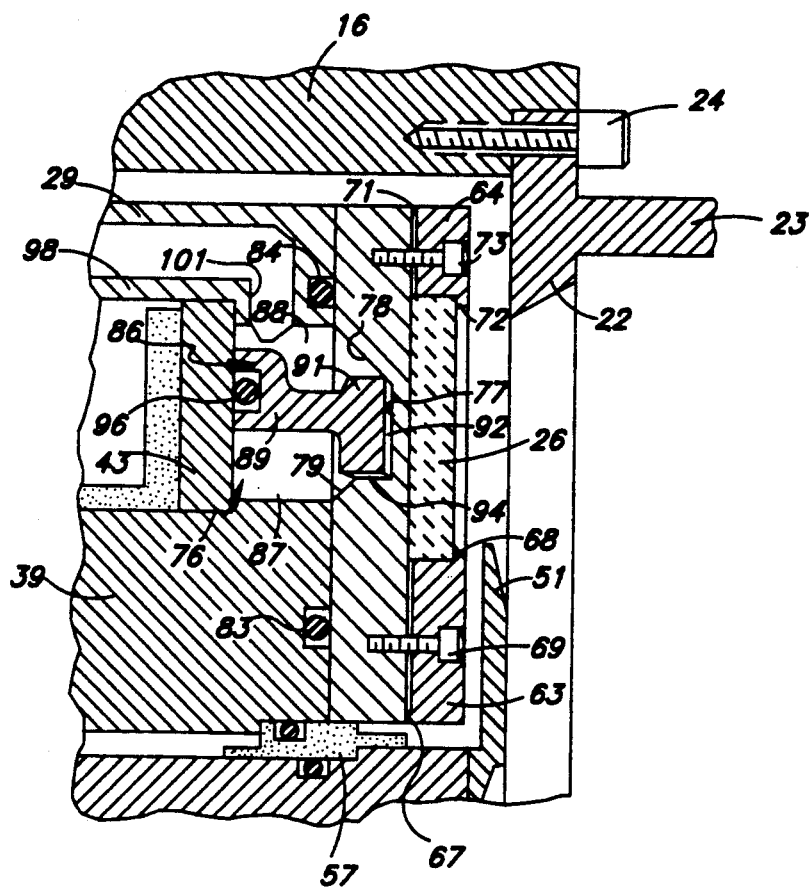
FIG. 2 is an enlarged sectional view of a portion of the embodiment of FIG. 1.
Figure 3:
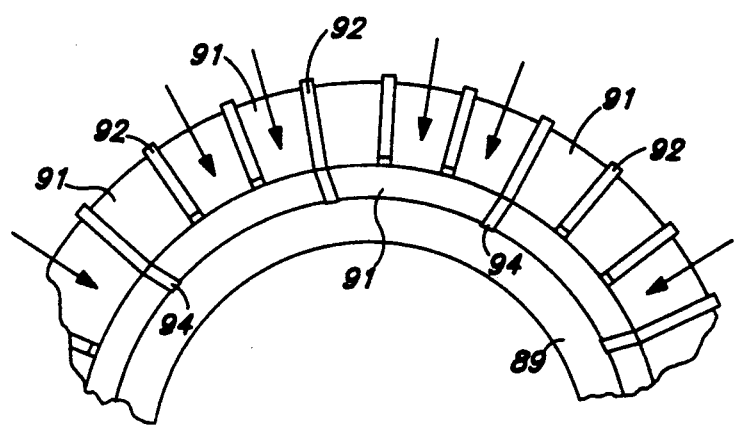
FIG. 3 is a fragmentary isometric view of a flow director for the coolant in the embodiment of FIG. 1.

The source, designated generally by the reference numeral 11, is adapted to be mounted in an opening 12 in the wall 13 of a sputtering chamber in which workpieces are coated. The workpieces can, for example, be disks which are coated with a magnetic material for storing computer data. The chamber is part of a reactor which has conventional means (not shown) for introducing an ionizable gas such as argon into the chamber and for removing spent gases from the chamber.

The source comprises a generally rectangular base plate 16 which mounts on the back side of the chamber wall, with a cylindrical flange 17 which projects in a forward direction through the opening in the wall. An O-ring 18 is mounted in an annular groove 19 in the face of the base plate and engages the back side of the chamber wall to provide a seal between the base plate and the chamber wall. The base plate is secured to the wall by mounting screws (not shown).

A shield 21 having an annular base 22 and a forwardly projecting cylindrical flange 23 is mounted on the front side of the base plate and is secured thereto by mounting screws 24. The shield is positioned coaxially of the sputtering target 26 and somewhat in front of the target, and the opening in the base has a conically tapered wall 27 which increases from a diameter slightly less than the outer diameter of the target to a diameter slightly less than the inner diameter of flange 23. The base plate and the shield are fabricated of an electrically conductive material such as aluminum and are maintained at ground potential.

A magnetic coil assembly 28 is mounted on the back side of base plate 16. This assembly comprises an outer cylindrical pole piece 29 having a radially projecting mounting flange 31 which is mounted on the base plate by mounting screws 32 and a retaining ring 33. The pole piece is insulated electrically from the base plate by insulator rings 34, 36 disposed respectively between the base plate and the mounting flange and between the mounting flange and the retaining ring. O-rings 37, 38 on either side of insulator ring 34 provide a vacuum-tight seal between the base plate and the pole piece.

The coil assembly also includes an inner cylindrical pole piece 39, an annular front pole piece or cap 41 and an annular rear pole piece or cap 42. The inner and outer pole pieces are disposed coaxially of each other and of shield 21, as are the front and rear pole pieces. An annular spacer 43 extends between the inner and outer pole pieces to the rear of the front pole piece and is welded thereto. The front and rear pole pieces are secured to the ends of the inner and outer pole pieces by screws (not shown). The pole pieces and spacer are fabricated of a magnetic material such as ferritic stainless steel.

A coil 46 of electrically conductive wire is wound on an insulative bobbin 47 which is mounted in the space between the inner and outer pole pieces. When energized, this coil produces a magnetic field which the pole structure directs to the region in front of the target. This field enhances the sputtering rate, permits operation at lower gas pressures, helps to confine the glow discharge to the vicinity of the target, and reduces electron bombardment of the workpiece.

The pole structure also serves as a cathode to which a negative potential is applied to ionize the gas in the chamber in front of target plate 26.

An anode post 49 is disposed coaxially within the pole structure, and projects to the front pole cap 41 and to the rear pole cap 42. A disk-like cap 51 having a diameter corresponding to the inner diameter of the target is mounted on the front end of the anode post and secured thereto by a screw 52. A cooling plate 53 is mounted on the anode post to the rear of pole piece 42 and is retained in place by a nut 54 threaded onto the post. The cooling plate is a generally rectangular plate with a passageway (not shown) through which a coolant is circulated to cool the anode post. The post, cap and cooling plate are fabricated of an electrically conductive material and are connected to an electrical potential which is positive relative to the cathode. Typically, the anode structure is connected to ground, and a negative potential is applied to the cathode structure.

The anode structure is insulated electrically from the cathode structure by an insulative sleeve 56 positioned between the post and inner cylinder 39, an insulator 57 between the post and the front portion of the pole assembly, and an insulative washer 58 between cooling plate 53 and rear pole cap 42. O-rings 59, 61 on the inner and outer sides of insulator 57 provide a vacuum seal between the post and the front portion of the pole structure.

Target 26 is mounted on pole cap 41 with the back side of the target in engagement with the front side of the pole cap. The target has an annular configuration and is disposed coaxially of the anode structure. In the embodiment illustrated, the target has a flat front surface which is parallel to the side of the pole cap. However, the target can be of any suitable configuration, and it might, for example, have a conically tapered surface and increase in thickness toward the outer periphery. The target is removably mounted on the pole cap by a pair of retaining rings 63, 64. These rings engage the target with a fulcrum-like action which maintains the back side of the target in tight thermal contact with the front side of the pole cap.

Inner retaining ring 63 has a fulcrum-like mounting foot in the form of rearwardly projecting flange or ridge 67 which extends around the inner periphery of the ring and bears against the front surface of the pole cap. This ring also has an outer peripheral flange 68 which extends in a radial direction and engages the inner peripheral margin of the front surface of the target. Mounting screws 69 positioned between the mounting foot and the flange draw the flange toward the pole cap with an increased force due to the fulcrum-like action of the ring as it deflects about the mounting foot, clamping the inner portion of the target tightly to the pole cap.

Outer retaining ring 64 has a fulcrum-like mounting foot in the form of rearwardly projecting flange or ridge 71 which extends around the outer periphery of the ring and bears against the front surface of the pole cap. This ring also has an inner peripheral flange 72 which extends in a radial direction and engages the outer peripheral margin of the front surface of the target. Mounting screws 73 positioned between the mounting foot and the flange draw the flange toward the pole cap with an increased force due to the fulcrum-like action of the ring as it deflects about the mounting foot, clamping the outer portion of the target tightly to the pole cap.

Retaining rings 63, 64 are fabricated of a material such as stainless steel. The stainless steel can be either magnetic or non-magnetic, depending upon the material to be deposited and the application for which the reactor is to be used.

A cooling passageway 76 is formed on the back side of pole cap 41 between spacer 43 and the pole cap. This passageway has a generally annular configuration and is formed in part by a recessed area on the back side of the pole cap. This recessed area has an annular bottom wall 77 which is parallel to the front surface of the cap, a conically tapered outer side wall 78, and an inner side wall 79 which is chamfered toward its outer end. The depth of the recessed area is approximately three-fourths of the thickness of the pole cap, which means that the portion of the cap between the passageway and the target is only about one-fourth as thick as the rest of the cap. This provides a better transfer of heat between the target mounted on the front side of the cap and the coolant in the passageway since the target is closer to the coolant yet totally isolated from it. O-rings 83, 84 provide a liquid-tight seal between the front cap and the remainder of the pole structure on the inner and outer sides of the passageway. The thin area of the pole cap is also readily saturated by the magnetic field produced by energization of coil 46, allowing for a higher magnetic field in the area in front of the target.

A flow control ring 86 in the passageway 76 separates the passageway into an inner section 87 and an outer section 88 and causes the coolant to flow at high velocity in a radial direction on the back side of the pole cap. This ring has a generally cylindrical body 89 which extends in an axial direction in the passageway, with an annular flange 91 which is received in the recessed area on the back side of the pole cap. The front surface of the flange is provided with a plurality of radially extending ridges or vanes 92 which serve as baffles to define a plurality of radially extending flow channels 93 through which the coolant passes. These vanes project a distance on the order of .010 inch from the surface of the ring.

The ring also has ridges or vanes 94 which project radially from the inner periphery of the ring and extend in an axial direction in alignment with the radially extending vanes. One presently preferred embodiment has twenty of the axially extending vanes and eight of the radially extending vanes, with the radially extending vanes being with the inner ends of every third one of the axially extending vanes.

A resilient O-ring 96 positioned between the body of the ring and spacer 43 urges vanes 92 into engagement with the bottom wall 77 of the recessed area and provides a seal between the body and the spacer so the coolant can only pass between the two sections of the passageway through the relatively shallow channels 93 in contact with the back side of the cap.

A coolant inlet passageway 97 is formed in the outer cylinder 29 and the rear cap 42 of the pole structure. This passageway consists of axially aligned bores 98, 99 in the cylinder and cap, and a short radially extending bore 101 which intersects bore 98 and opens into the outer section 88 of passageway 76. An O-ring 102 encircles passageway 97 and provides a seal between the outer cylinder and the rear cap.

A coolant outlet passageway 103 is formed in the inner cylinder 39 and the rear pole cap 42. This passageway consists of axially aligned bores 104, 106 in the cylinder and cap, a radial bore 107 which intersects bore 104 and opens into the inner section 87 of passageway 76, a radially extending bore 108 which intersects bore 106 and a bore 109 which intersects bore 108 and opens through the back side of pole cap 42. An O-ring 111 surrounds passageway 103 and provides a liquid-tight seal between the outer cylinder and the rear pole cap.

A coolant, such as water, is supplied to the inlet passageway removed from the outlet passageway through hoses or lines (not shown) connected to the respective passageways by threaded fittings which are received in bores 99, 109. In one presently preferred embodiment, the coolant is circulated first through the cathode structure, then through the anode cooling plate. In this particular embodiment, the line connected to inlet passageway 97 is connected to the outlet of a source of coolant, the line connected to outlet passageway 103 is connected to the inlet of the passageway in anode cooling plate 53, and the outlet of cooling plate passageway is connected to a return line to the source.

The invention has a number of important features and advantages. The target is isolated from the coolant in that the coolant does not come into direct contact with the target, although heat is efficiently transferred from the target to the coolant through the relatively thin portion of the pole cap behind the target. The retaining rings permit the target to be readily removed and replaced, or changed, and the fulcrum-like action of the retaining rings holds the target tightly against the front surface of the pole cap and assures good heat transfer between the two. The target can be changed without disturbing any of the seals in the cooling system, and there is no bond to break to recover the unused material from a spent target. The absence of a bond also significantly reduces the cost of the target. Moreover, burn through of the stainless steel pole cap is much less likely than burn through of a copper backing plate as used in the prior art in the event of a target burn through.

It is apparent from the foregoing that a new and improved sputter coating source has been provided. While only one presently preferred embodiment has been described in detail, as will be apparent to those familiar with the art, certain changes and modifications can be made without departing from the scope of the invention as defined by the following claims.

I claim:

1. In a magnetically enhanced sputter coating source adapted to sputter deposit magnetic materials: a cathode pole structure having a front side and a back side and comprising ferromagnetic material capable of supporting a magnetic field, an anode insulated electrically from said cathode pole structure, means for applying an electrical potential between the anode and said cathode pole structure, means adapted to support and removably mount a target of magnetic material on the front side of said cathode pole structure, magnetic means positioned at the rear side of said cathode pole structure, means for creating a magnetic field extending outwardly from said magnetic means and through said cathode pole structure and through a magnetic target mounted on said cathode pole structure and into a region in front of the target, means defining a cooling passageway on the back side of said cathode pole structure and between said cathode pole structure and said magnetic means, an annular recessed area in the back side of said cathode pole structure which reduces the cathode pole thickness in such area, said recessed area being connected to said cooling passageway to enhance the cooling effect through the recessed area in said cathode pole structure to readily cause magnetic saturation in said cathode pole structure adjacent to said recessed portion and through a ferromagnetic target in position on said cathode pole structure when a magnetic field is created by said magnetic means, means for passing a coolant through the passageway to cool said cathode pole structure and the target, and means sealing the front side of said cathode pole structure so that the coolant does not come into direct contact with a target in position on said cathode pole structure and so that the coolant remains contained when a target is not in place on said cathode pole structure or in the event that a target is eroded through by the sputtering of material therefrom.

2. The sputter coating source of claim 1 wherein the cathode pole structure comprises an annular plate, the cooling passageway has an annular configuration, and the means for passing the coolant through the passageway includes means for directing the coolant to flow in a radial direction on the back side of the annular plate.

3. The sputter coating source of claim 2 wherein the means for directing the coolant in a radial direction comprises a flow control ring which extends axially within the passageway and separates the passageway into an inner section and an outer section, said ring having an axially facing surface in closely spaced relation to a surface on the back side of the annular plate, with a plurality of baffles extending radially between the two surfaces and defining channels for carrying the coolant between the inner and outer sections of the passageway in contact with the annular plate.

4. In a magnetically enhanced sputter coating source to deposit magnetic materials: an axially extending anode, a cathode having a body with an axially facing front surface and the rear surface of an annular plate of ferromagnetic material capable of supporting a magnetic field therethrough fixedly mounted against the front surface of the body, the rear surface of said plate having an annular recessed area which reduces the plate thickness in such area, means to create a magnetic field which extends through said plate outwardly of said cathode, a support means for an annular target of magnetic material adapted to be removably mounted on the front surface of the pate, an annular cooling passageway at the junction of the body and the plate, said recessed area of said plate being in fluid connection with said passageway, means for passing a coolant through the passageway to cool the plate and a target mounted thereon, and means providing a liquid-tight seal between the body and the plate on either side of the passageway to prevent the coolant from getting to the front side of the plate.

5. The sputter coating source of claim 4 wherein the annular passageway is formed partly in the front portion of the body and partly in the rear portion of the annular plate.

6. The sputter coating source of claim 4 wherein the means for passing the coolant through the passageway comprises a flow control ring which extends axially within the passageway and separates the passageway into an inner section and an outer section, said ring having an axially facing surface in closely spaced relation to a surface on the back side of the annular plate, with a plurality of baffles extending radially between the two surfaces and defining channels for carrying the coolant between the inner and outer sections of the passageway in contact with the annular plate.

7. A source in accordance with claim 4 in which said plate thickness in the recessed area is approximately one-fourth the thickness of the plate in other areas.

* * * * *